(12) United States Patent
Takenoshita et al.

(10) Patent No.: US 7,301,767 B2
(45) Date of Patent: Nov. 27, 2007

(54) ELECTRONIC EQUIPMENT INCLUDING AN APPARATUS FOR COOLING INTERIOR OF HOUSING

(75) Inventors: Hiroyuki Takenoshita, Sagamihara (JP); Hideki Sasaki, Komae (JP); Tomohisa Nakamura, Yokohama (JP); Seiji Koyama, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 11/259,314

(22) Filed: Oct. 26, 2005

(65) Prior Publication Data

US 2006/0126289 A1   Jun. 15, 2006

(30) Foreign Application Priority Data

Oct. 27, 2004   (JP)   ............................. 2004-311873

(51) Int. Cl.
*G06F 1/20* (2006.01)
(52) U.S. Cl. .......................... 361/695; 165/80.3; 60/527
(58) Field of Classification Search ........ 361/687–697, 361/709; 267/675; 165/80.3–80.4; 211/41.14; 60/527, 528
See application file for complete search history.

(56) References Cited

U.S. PATENT DOCUMENTS

| | | | | |
|---|---|---|---|---|
| 5,640,302 A | * | 6/1997 | Kikinis | .................. 361/687 |
| 6,278,607 B1 | * | 8/2001 | Moore et al. | ............... 361/687 |
| 6,542,360 B2 | * | 4/2003 | Koizumi | .................... 361/687 |
| 6,621,698 B2 | * | 9/2003 | Chang | ........................ 361/687 |
| 6,668,550 B2 | * | 12/2003 | Yazawa et al. | ............... 60/527 |
| 6,687,123 B2 | * | 2/2004 | Kitahara | .................... 361/695 |
| 6,791,835 B2 | * | 9/2004 | Hashimoto et al. | ......... 361/687 |
| 2002/0018335 A1 | * | 2/2002 | Koizumi | .................... 361/687 |
| 2002/0105783 A1 | * | 8/2002 | Kitahara | .................... 361/695 |
| 2004/0080909 A1 | * | 4/2004 | Kitahara | .................... 361/687 |

\* cited by examiner

*Primary Examiner*—Lisa Lea-Edmonds
(74) *Attorney, Agent, or Firm*—James R. Nock

(57) ABSTRACT

An electronic equipment of the present invention includes housings and, a substrate, electronic components mounted on the substrate, a heatsink which is connected to the electronic component, connection means and for connecting the heatsink to the housing depending on a temperature in the housing and for forming a heat conduction path from the electronic component to the housing, and a fan for flowing cooling air into the housing. The substrate, the electronic component, the heatsink, the connection means, and the fan are arranged in the housing. Depending on the temperature, the connection means promotes heat transfer from the heatsink to the housing, which has a large radiation area, in addition to a cooling (radiation) operation using the fan. As a result, the cooling of the electronic component inside the housing is promoted during operation. By this cooling effect, the present invention improves reliability and safety against heat generation of the electronic component (in particular, a central processing unit).

5 Claims, 6 Drawing Sheets

(A)  (B)

(A) NO LOAD  (B) AT LOW TEMPERATURE ($T_L$°C)  (C) AT HIGH TEMPERATURE ($T_H$°C)

ELECTRONIC EQUIPMENT INCLUDING AN APPARATUS FOR COOLING INTERIOR OF HOUSING

FIELD OF THE INVENTION

The present invention relates to electronic equipment, and more specifically to an apparatus for cooling the interior of an electronic equipment housing.

BACKGROUND OF THE INVENTION

In recent years, higher performance and higher densities of electronic components inside small electronic equipment (such as a portable personal computer (PC)) are being achieved. Along with the progress toward higher performance and higher densities, heat generation by electronic components, such as a Central Processing Unit (CPU), is becoming a major problem during operation. As the size of a housing tends to become thinner, lighter, and smaller, heat generated by electronic components in the housing is apt to remain inside the housing. To ensure adequate performance and reliability of the electronic component, it is essential to cool down the heat generated by the electronic component promptly.

Many types of electronic equipment apply the following cooling mechanism to remove the heat inside their housings. Specifically, heat from electronic components is firstly transferred to a heatsink which is made of a material having high thermal conductivity. Outside air is taken into the housing by use of a fan to create an air flow. The heatsink is cooled by the air flow. The heat generated by the electronic component is removed from a surface of the heatsink together with the air. To create the air flow, the housing includes an inlet port for taking the outside air in and an exhaust port for discharging the heated air out.

However, when a fan for air cooling is disposed inside a housing of a small piece of electronic equipment, the fan is limited to a small size because the size of the housing tends to be thinner, lighter, and smaller. As a result, an air volume of the fan is reduced, whereby the air flow can hardly flow inside the congested housing. As a consequence, it is difficult to supply a sufficient amount of the air onto the surface of the heatsink for cooling purposes. That is to say, in small electronic equipment, it is not possible to perform sufficient cooling only by use of the above-described cooling mechanism utilizing the heatsink and the air flow. When the electronic component such as the CPU is not cooled down sufficiently, a malfunction and a failure of the electronic component are caused, and problems arise in light of safety and reliability.

Conventional techniques for cooling small electronic equipment (e.g., a PC) are disclosed in Japanese Utility Model Publications Nos. 3064584 and 3043379, for example. However, these publications merely disclose the technique to cool the inside of a housing of a PC simply by use of a fan. In other words, these publications do not disclose a sufficient technique especially for cooling small electronic equipment.

An object of the present invention is to cool electronic components generating heat during operation, the electronic components residing within a housing of an electronic equipment.

Another object of the present invention is to provide an electronic equipment, which is capable of changing a thermal conduction path for discharging heat generated by electronic components inside a housing out of the housing, increasing freedom of thermal design, and transferring the heat to a necessary spot.

SUMMARY OF THE INVENTION

An electronic equipment of the present invention includes a housing, a substrate, electronic components mounted on the substrate, a heatsink which is connected to the electronic component, connection means for connecting the heatsink to the housing depending on a temperature in the housing and for forming a heat conduction path from the electronic component to the housing, and a fan for flowing cooling air into the housing. Here, the substrate, the electronic component, the heatsink, the connection means, and the fan are arranged in the housing.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENT

Figure 1:
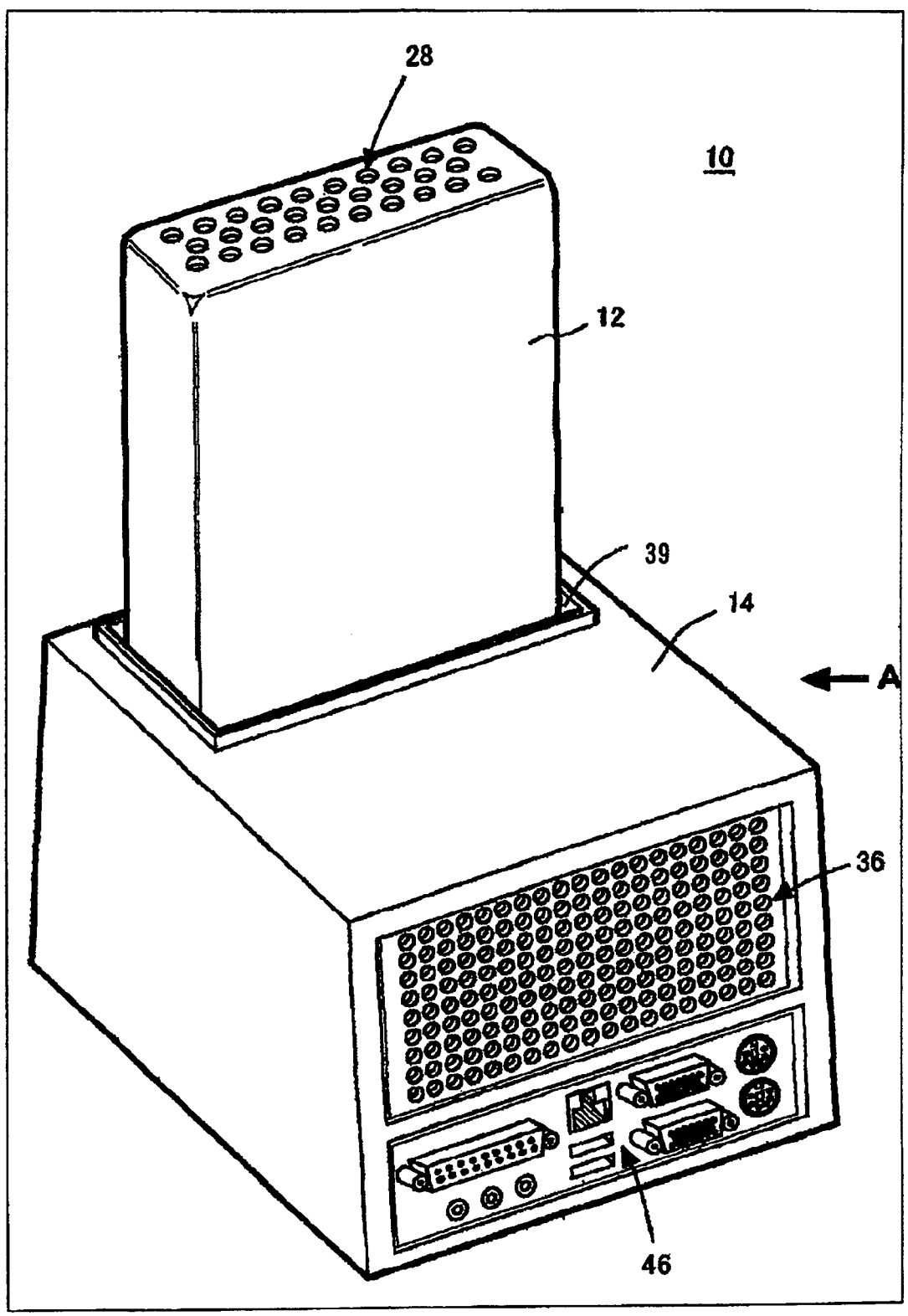
FIG. 1 is a view of a PC of the present invention, which is illustrated from a viewpoint obliquely above and behind the PC.
Figure 2:
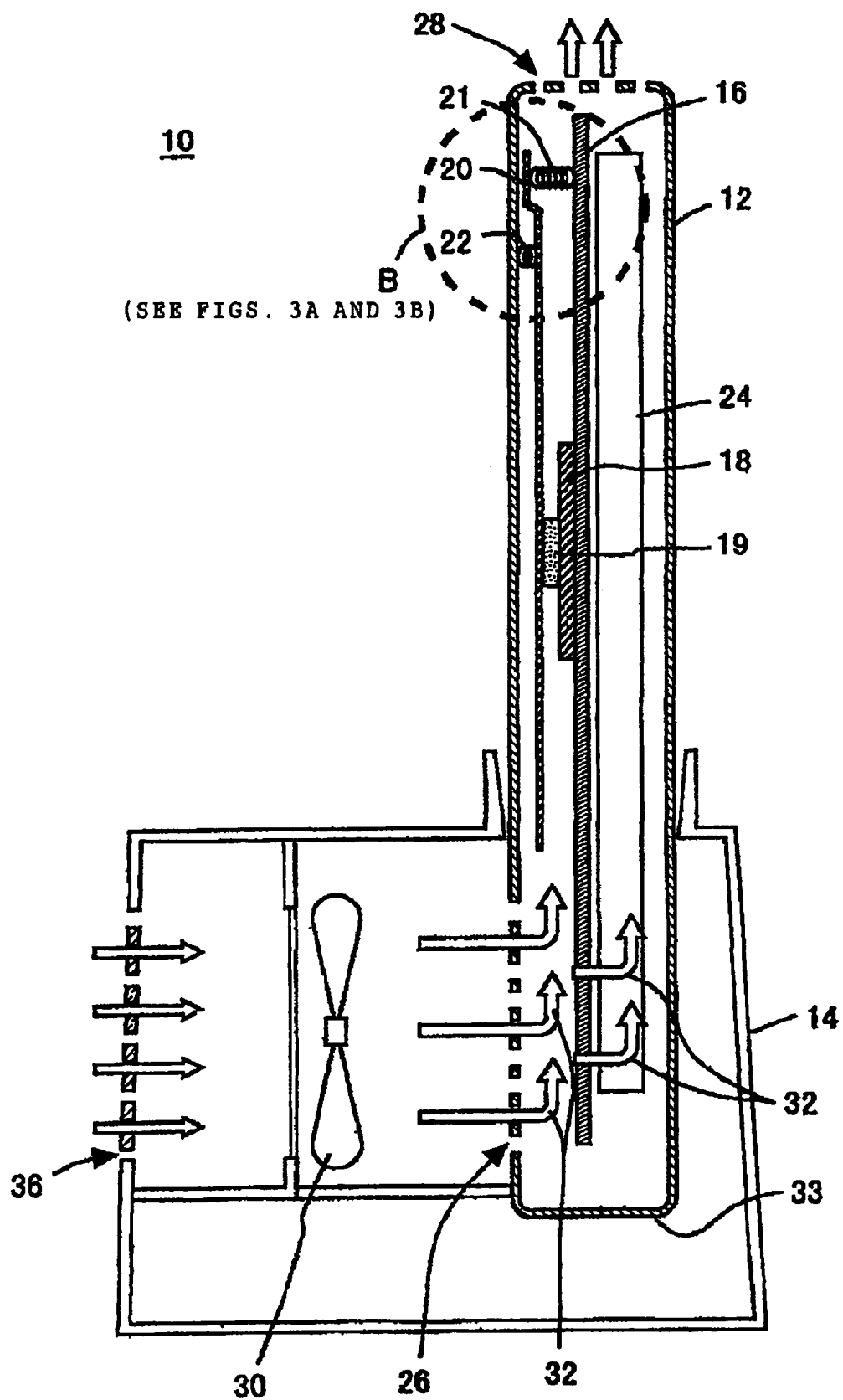
FIG. 2 is a cross-sectional view of the PC of the present invention shown in FIG. 1.
Figure 3:
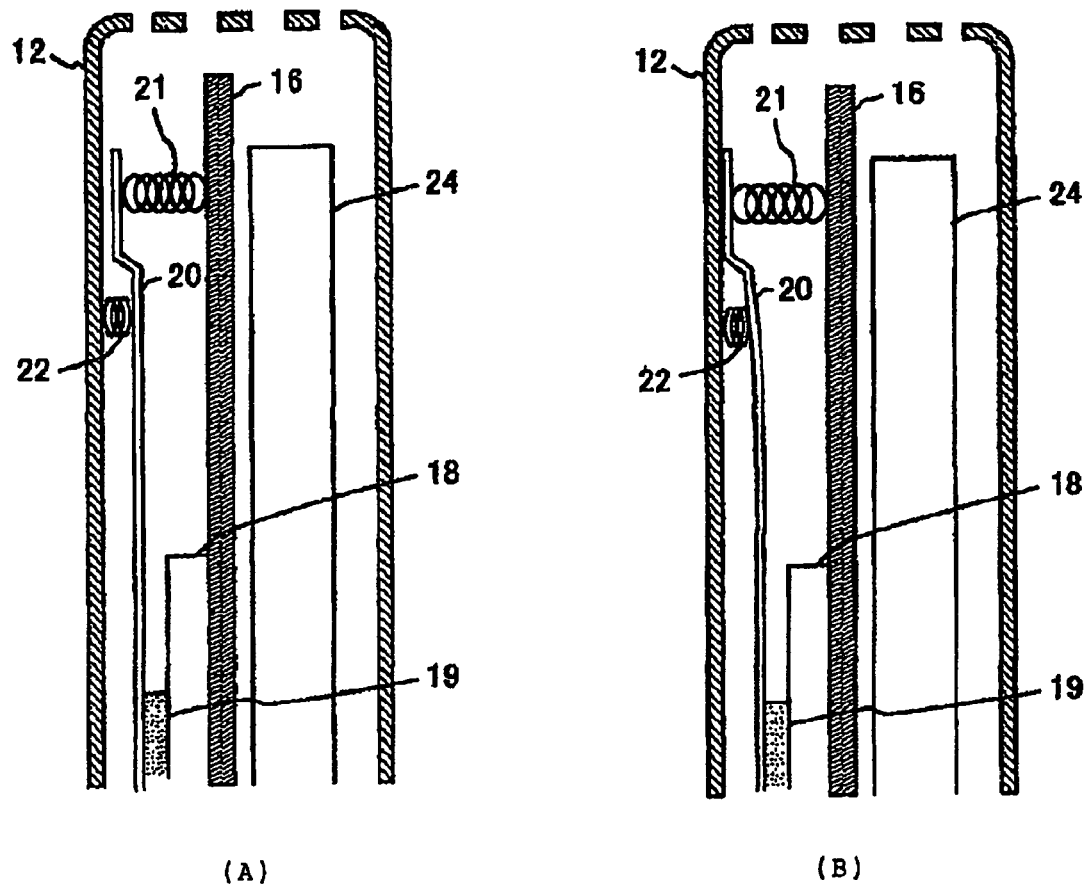
FIGS. 3A and 3B are enlarged views of a portion B shown in FIG. 2.

An embodiment of the present invention will now be described in terms of a portable PC as an example. Note that the present invention is not limited only to the PC, and it is needless to say that the present invention is also applicable to other electronic equipment. FIG. 1 is a view of a portable PC 10 according to an embodiment of the present invention, which is illustrated from a viewpoint obliquely above and behind the portable PC 10. FIG. 2 is a cross-sectional view of the PC shown in FIG. 1, which is viewed from a direction A. FIGS. 3A and 3B are enlarged views of a portion B indicated in FIG. 2. Now, the embodiment will be described with reference to these drawings.

A housing includes a core housing 12 and a cradle housing 14. A CPU 18 on a substrate 16, a heatsink 20 connected to the CPU 18 through a heat-conductive elastic body 19, means 21 and 22 for connecting an end of the heatsink 20 to the core housing 12 are disposed in the core housing 12. Moreover, the core housing 12 includes electronic components 24 such as a memory, various ICs or a HDD (details are omitted herein).

An end 33 of the core housing 12 includes a connector (not shown) for establishing electrical connection. The connector is attachable to and detachable from another connector (not shown) disposed on the substrate provided for an interface (I/O) 46 located at the bottom of an opening 39 of the cradle housing 14. The core housing 12 is operated as a PC when docked to the connector of the cradle housing 14. Meanwhile, the core housing 12 is detachable from the cradle housing 14 and is portable. The core housing 12 is also operated as a PC when docked to another cradle housing in a different place. The cradle housing 14 mainly incorporates a power source and an interface (I/O) for an external device (such as a display device, a keyboard or a mouse). Reference numeral 46 in FIG. 1 denotes I/O connectors. A fan 30 is placed inside the cradle housing 14.

Air is taken from an aperture 36 of the cradle 14 into the housing by use of the fan 30. The air from the fan 30 enters from an aperture 26 of the core housing 12 into the core housing 12, and flows inside the core housing 12 as an air flow 32, which is discharged from an aperture 28 located on an upper part. The air flow 32 flows in a space between the substrate 16 and the heatsink 20 and in a space between the heatsink 20 and the housing 12. Electronic components which generate heat during operation, such as the CPU 18, as well as both surfaces of the heatsink 20 and the rear surface of the housing 12 are cooled by the air flow 32. In particular, the heat from the CPU 18 which often reaches a high temperature is transferred to the heatsink 20 through the heat-conductive elastic body 19, and is removed from the heatsink 20 together with the air. A similar effect can be obtained when the air flow 32 runs in the opposite direction to the direction illustrated in FIG. 2. The cooling mechanism utilizing the heatsink and the air flow described herein is similar to the related art.

Figure 4:
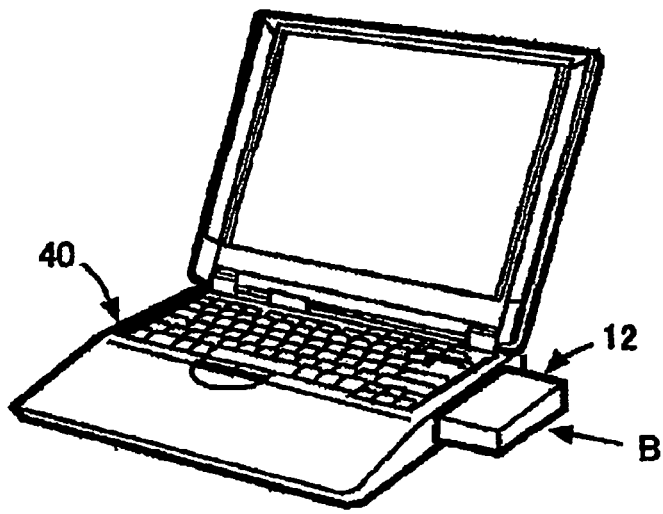
FIG. 4 is a solid view showing a core housing of the present invention, which is docked to a notebook PC.
Figure 5:
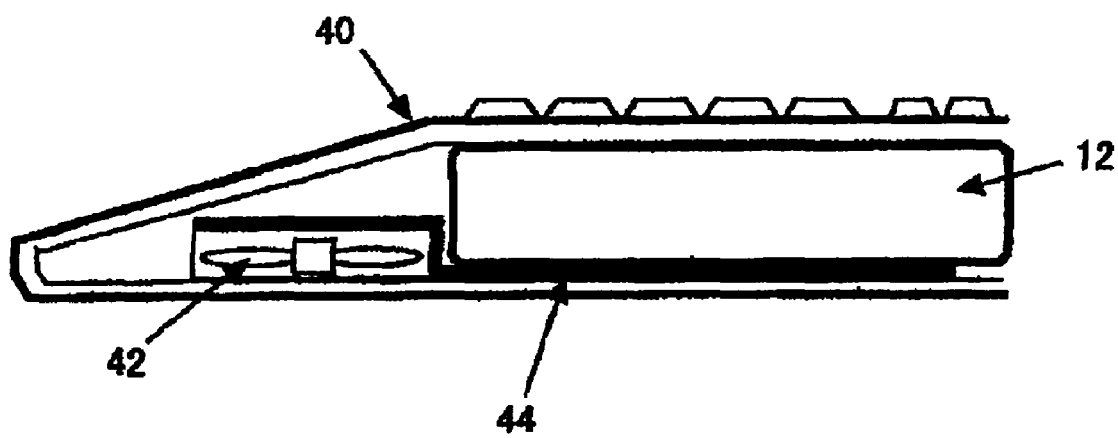
FIG. 5 is a cross-sectional view of the notebook PC shown in FIG. 4, which is viewed from a direction B.

FIG. 4 is a solid view showing the core housing 12 docked to a notebook PC 40. FIG. 5 is a cross-sectional view of the PC shown in FIG. 4, which is viewed from a direction B. The PC 40 includes a fan 42 and a heatsink. As shown in FIG. 4, when the core housing 12 is docked to a housing of the notebook PC, a housing of a car navigation system for an automobile, or the like instead of the cradle housing 14, the size of the fan used in such a device would become rather small because of space limitations. Blades of the fan shown in FIG. 2 can be located in a perpendicular position to the core housing 12, and it is therefore possible to secure a large fan size to a certain degree. Accordingly, a sufficient air volume is expected. For example, it is possible to use a 50-mm square fan (air volume: about 0.25 m³/min) herein.

Meanwhile, the housing of the notebook PC or the like is formed into a thin profile, and the fan therein can be disposed only in a thickness direction. Accordingly, the size of the fan is limited to a small horizontal type (a blower fan). For example, the size of the fan is limited to a 40-mm square to 30-mm square. In this case, the air volume will be in a range of about 0.12 to 0.08 m³/min in the case of the 40-mm square and in a range of about 0.09 to 0.055 m³/min in the case of the 30-mm square, which are equivalent to about a half to one-third of the performance of the 50-mm square. As a consequence, it is not possible to obtain a sufficient cooling effect just by use of the heatsink 20 contacting a heat-generating element (the CPU). Therefore, the heat may remain inside the core housing 12 and cause a temperature rise. Such a temperature rise may incur a decline in the performance or thermal runaway of the CPU.

The core housing 12 is required not to degrade the performance of the electronic component (the CPU) when docked either to the cradle housing 14 or to the notebook PC. Particularly when the core housing 12 is docked to a device having a small air volume due to a small fan in lieu of the cradle housing 14, the cooling mechanism utilizing the heatsink and the air flow cannot exert a sufficient cooling effect. In this regard, the present invention provides the following devices.

A first device is to dispose the heatsink 20 while providing a space equal to or above 0.5 mm away from the rear surface of the housing 12. In this way, the air flow 32 can flow in the space between the heatsink 20 and the housing 12, and cool down the heatsink 20 as well as the inner surface of the housing at the same time. As a result, it is possible to cool down the electronic component and to suppress a temperature rise on the surface of the housing. Here, an aluminum (Al) plate having a thickness of 0.3 mm (product code A1010) is used as the heatsink. Meanwhile, lightweight and highly rigid metal such as Al, an Mg alloy or a Ti alloy is used as the housing.

A second device is to provide the connection means 21 and 22. The connection means is configured to connect an end of the heatsink 20 to the housing depending on the temperature in the housing, and thereby to form a heat conduction path from the CPU 18 to the housing. In FIGS. 3A and 3B, the connection means includes two compression springs 21 and 22. The spring 21 expands and contracts depending on the temperature. A shape-memory alloy having a fine shape-memory characteristic and a long repetitive life, such as a Ni—Ti alloy, is used as the material of the spring 21. It is also possible to use a Ni—Ti—Co alloy, a Ni—Ti—Cu alloy, and the like as the shape-memory alloy. The spring 22 is a compression spring made of stainless steel without a temperature dependency.

Here, an application example of using a Ni—Ti system shape-memory alloy coil spring as the spring 21 will be described. The elastic coefficient of the shape-memory alloy coil spring is not constant as in a usual coil spring, but varies depending on the temperature. Therefore, in consideration of characteristics of the spring, it is necessary to add a temperature factor to a relation between flexure and a load of a usual spring. Now, characteristics of the spring reflecting addition of the temperature factor will be described below.

Figure 6:
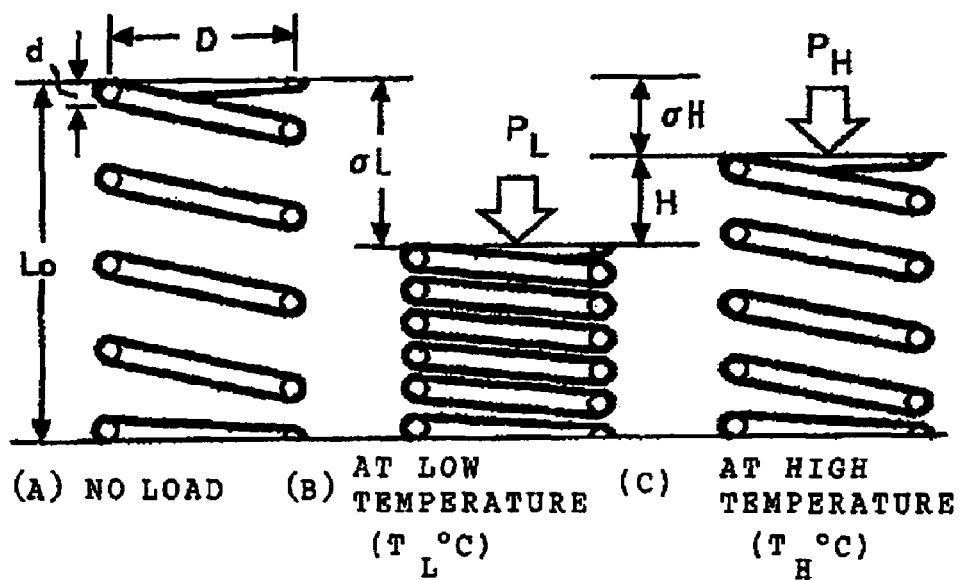
FIGS. 6A to 6C are schematic views showing actions of a coil spring.

FIGS. 6A to 6C are schematic drawings showing actions of the coil spring. FIG. 6A shows a state of the unloaded spring. FIG. 6B shows a state of the spring balanced with a bias force PL applied from the spring 22 at a low temperature (at TL° C.). FIG. 6C shows a state of the spring balanced with a bias force PH at a high temperature (at TH° C.). As the spring 22 in FIGS. 3A to 3C is assumed to be a compression spring (a bias spring), calculation will be made on the general assumption that PH is greater than PL. Note that the bias force will be deemed constant in order to facilitate calculation.

The shape-memory alloy coil spring also satisfies general formulae of a spring. Specifically, a load P and flexure σ are expressed by the following formulae when respectively replaced by twisting stress τ and twisting strain γ thereof:

$$\tau = 8k \cdot D \cdot P/(\pi n \cdot D^3) \tag{1}$$

$$\gamma = k \cdot d \cdot \sigma/(\pi n \cdot D^2) \tag{2}$$

k: stress correction factor, k=c/(c−1)+½c, c=D/d (the Wood's formula)
d: diameter of coil wire
D: average diameter of coil (see FIG. 6A)

Figure 7:
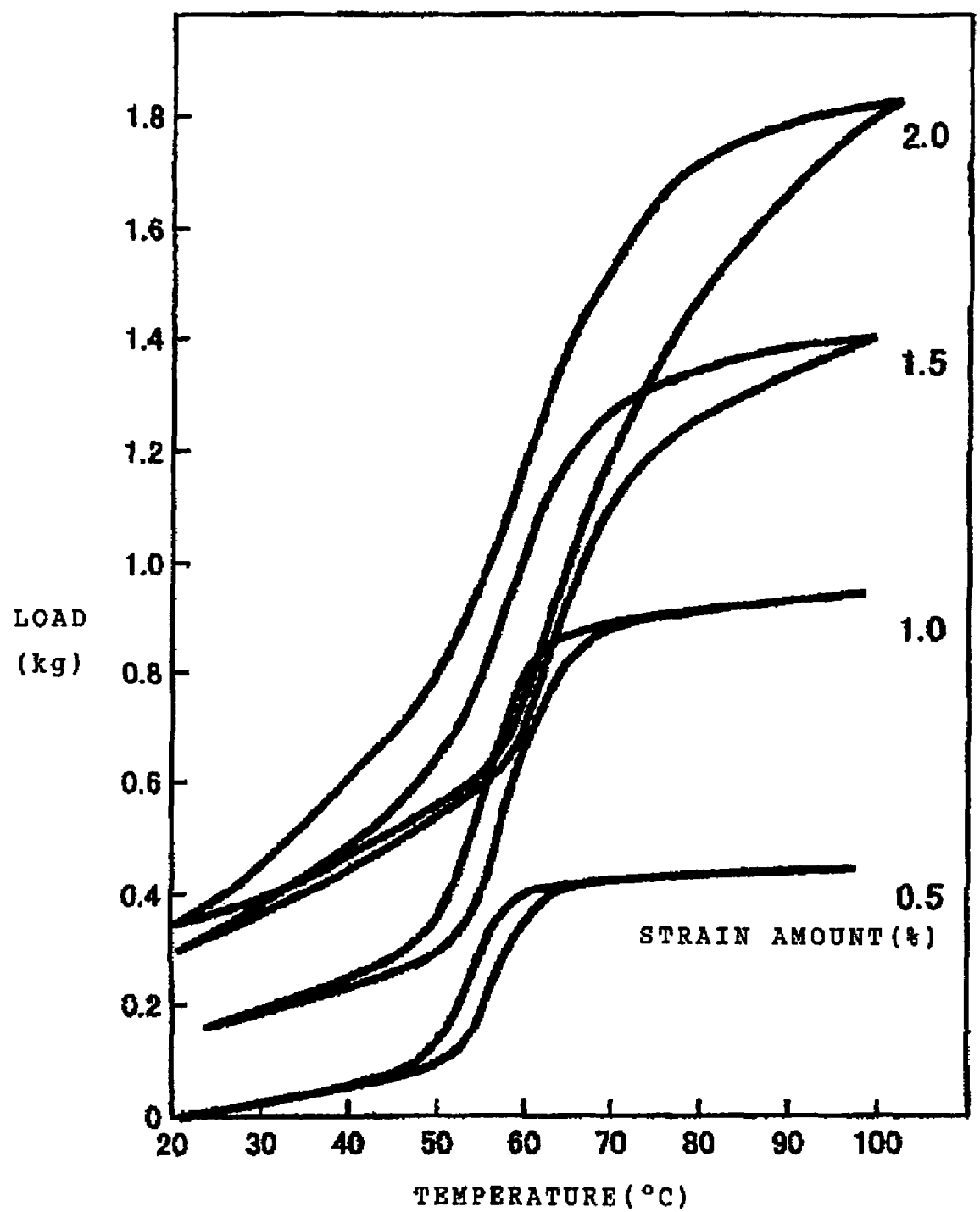
FIG. 7 is a graph showing a relation between a temperature and a load of a Ni—Ti shape-memory alloy at constant flexure σ.
Figure 8:
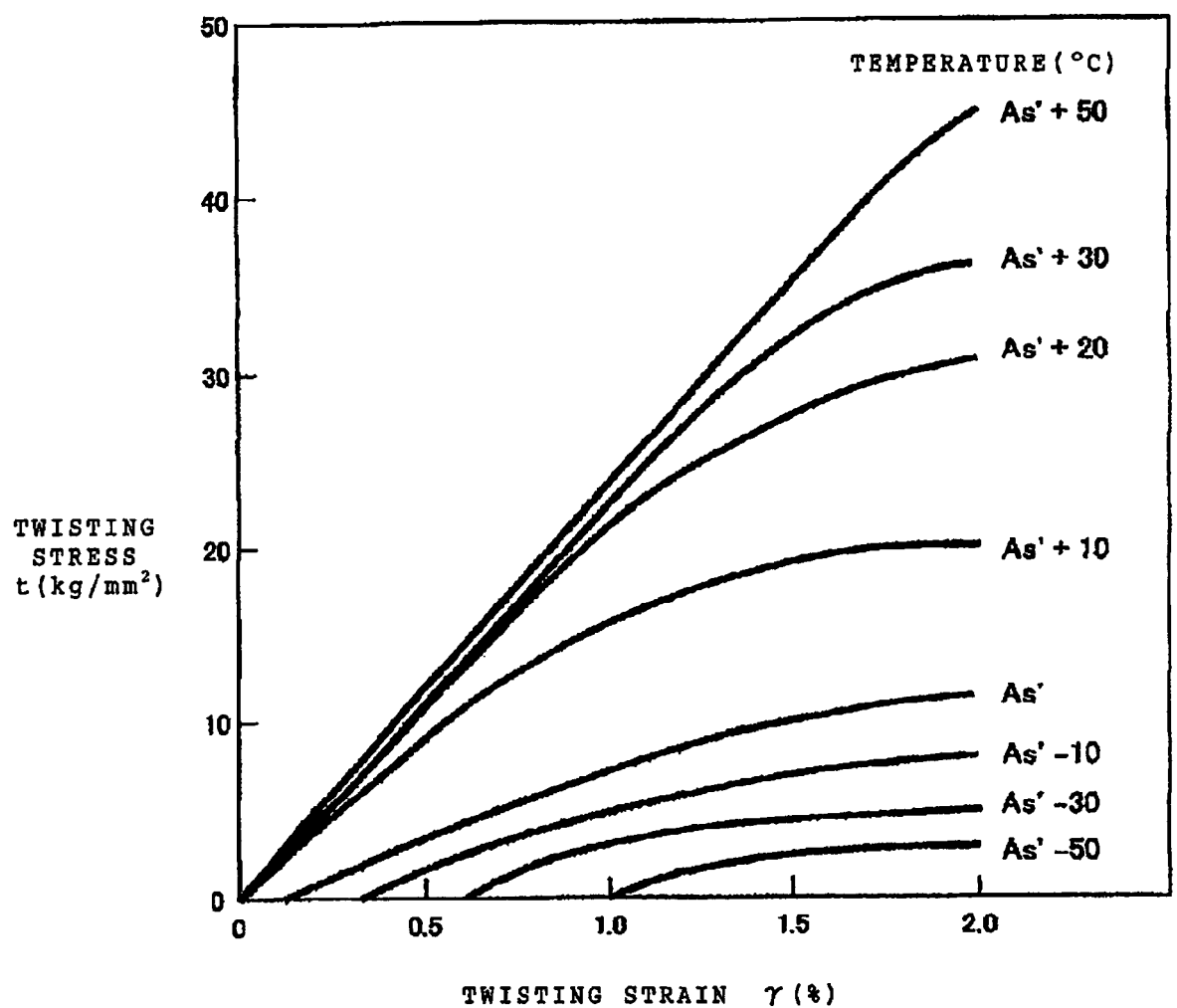
FIG. 8 is a graph showing τ-γ diagrams representing relations between twisting stresses τ and twisting strains γ of the Ni—Ti shape-memory alloy.

A relation between the temperature and the load at constant flexure σ is shown in FIG. 7. The shape-memory alloy is normally operated in response to a rise and a drop of the temperature. Therefore, a τ-γ diagram between the twisting stress τ and the twisting strain γ is found by use of a relation diagram between the temperature and the load or a relation diagram between the temperature and the flexure. An example of the τ-γ diagram are shown in FIG. 8. Amounts of flexure σH and σL of a coil are derived from the loads PH and PL shown in FIGS. 6B and 6C by use of the τ-γ diagram (FIG. 8). First, the loads PH and PL are converted into stress values τ:

$$\tau H = 8k \cdot D \cdot PH/(\pi n \cdot d^3) \quad (3)$$

$$\tau L = 8k \cdot D \cdot PL/(\pi n \cdot d^3) \quad (4)$$

Strain amounts γH and γL at the respective temperatures TH and TL are derived from the values τH and τL by use of the τ-γ diagram (FIG. 8). Then, the amount of flexure σ of the coil is found by the following formula applying the above-described formula (2):

$$\sigma = \pi n \cdot D^2 \cdot \gamma/(k \cdot d) \quad (5)$$

Each of the amounts of flexure σH and σL of the coil at the high temperature and at the low temperature are expressed as follows:

$$\sigma H = \pi n \cdot D^2 \cdot \gamma H/(k \cdot d) \quad (6)$$

$$\sigma L = \pi n \cdot D^2 \cdot \gamma L/(k \cdot d) \quad (7)$$

Therefore, a stroke amount (an amount of change) H of the shape-memory alloy coil shown in FIGS. 6A to 6C is defined as:

$$H = \sigma H - \sigma L = \pi n \cdot D^2 \cdot (\tau H - \tau L)/(k \cdot d) \quad (8)$$

The symbols used in the formulae (1) to (8) are explained below:

d: diameter of coil wire (mm)
D: average diameter of coil (mm)
n: effective wire turns of coil
L: free length of coil (mm)
τ: twisting stress (kg/mm$^2$)
γ: twisting strain
P: load (kg)
σ: flexure (mm)
C: spring index
k: stress correction factor Now, a concrete example of the spring 21 shown in FIGS. 3A and 3B will be described. The strain amount of the shape-memory alloy is set equal to 1.0%, the diameter d of the coil wire is set equal to 1.0 mm, the average diameter D of the coil is set to 7 mm, and the effective wire turns N of the coil is set equal to 5. By use of the graph in FIG. 7 showing the strain amount equal to 1.0%, the load at a temperature of 50° C. is approximately equal to 0.3 kgf, and the load at a temperature of 60° C. is approximately equal to 0.7 kgf. The twisting stresses τH and τL at these temperatures are equal to 15.447 kgf/mm$^2$ and 6.620 kgf/mm$^2$, respectively. The twisting strains γH and γL are equal to 1.1% and 0.3%, respectively. The amounts of flexure σH and σL of the coil are equal to 6.839 mm and 1.865 mm, respectively. Therefore, the stroke amount H of the shape-memory alloy is equal to 4.974 mm. The spring 22 in FIGS. 3A and 3B has a spring force equal to 0.3 kgf, and thereby maintains the state shown in FIG. 3A at the low temperature (50° C.). When the temperature inside the housing is raised to the high temperature (60° C.), the spring 21 expands by 4.974 mm and generates a force approximately equal to 0.7 kgf. Accordingly, the spring 21 presses the heatsink 20 by a force approximately equal to 400 gf. As a result, the heatsink is pressed against the housing (FIG. 3B).

The functions of the connection means 21 and 22 in FIGS. 3A and 3B are summarized as follows. As the PC is operated, the spring 21 gradually expands in response to its expansion rate (mm/° C.) with the temperature rise inside the housing. FIG. 3A shows a state in the course of expansion of the spring 21. The spring 22 gradually contracts in response to expansion of the spring 21, and the heatsink 20 approaches the housing 12 at the same time. When the temperature reaches a predetermined temperature (e.g. 50° C.), an end of the heatsink 20 is pressed against the housing 12 (FIG. 3B). At a temperature equal to or above the predetermined temperature, the end of the heatsink 20 remains connected to the housing. The heat from the CPU 18 is transferred to the housing 12 through the heat-conductive elastic body 19 and the heatsink 20. The heat transferred to the housing is removed by the air flow 32 flowing on the rear surface of the housing. Simultaneously, the heat is radiated from the front surface of the housing to the outside. In this case, the housing having a large surface area functions as a new heatsink per se. The cooling effect on the CPU 18 is improved by the heat transfer to the housing and the radiation from the housing. When the temperature inside the core housing 12 falls below the predetermined temperature (e.g. 50° C.), the amount of contraction of the spring 21 is increased and the end of the heatsink 20 is thereby detached from the housing. The spring 22 moves the heatsink quickly with a change from the high temperature to the low temperature. Moreover, the spring 22 functions to maintain the heatsink 20 at a constant distance (e.g. 0.5 mm) away from the housing.

The following data show the temperature of the CPU at a time when the core housing 12 is connected to the cradle housing 14, the temperature inside the housing, and the temperature on the front surface of the housing, which are measured in terms of the related art and the present invention.

|  | (1) | (2) |
|---|---|---|
| Temperature of CPU: | 72.0° C. | 68.1° C. |
| Temperature inside housing: | 62.7° C. | 59.3° C. |
| Temperature on front surface of housing: | 53.7° C. | 54.1° C. |

(1): Related art (50-mm square fan at 40% operation, heatsink and housing no contact)

(2): Present invention (50-mm square fan at 40% operation, heatsink and housing in contact)

Here, the temperature of the CPU represents a temperature in the vicinity of the heat-conductive elastic body, the temperature inside the housing represents an average temperature of the heatsink, and the temperature on the front surface of the housing represents an average temperature on the front surface of the housing close to the CPU, respectively. The size of the heatsink used herein is made of Al (A1010) having dimensions of 50 mm×100 mm×0.3 mm. As shown in these measurement results, the present invention can reduce the temperature of the CPU by about 4° C. and the temperature inside the housing by about 3° C. compared with the related art when the core housing is docked to the cradle housing incapable of securing a sufficient air volume.

As described above, the PC 10 according to the present invention performs cooling only by the air flow generated with the fan when the temperature inside the housing is relatively low (e.g. equal to or below 50° C.). In this case, since there is the space between the heatsink and the housing which is equal to or above 0.5 mm, the air flow 32 can flow between the heatsink and the housing and suppress a temperature rise on the front surface of the housing. At a high temperature (e.g. equal to or above 50° C.), the housing is utilized as an additional heatsink in addition to cooling by the air flow, and a radiation (cooling) effect is improved by increasing a radiation area. As a result, the temperature of the electronic component inside the housing is reduced during operation, thereby improving reliability and safety in terms of heat generation of the PC.

The present invention has been described on the PC shown in FIG. 1 to FIG. 5 as an example. However, the present invention is not limited to the foregoing. For example, instead of using the springs having the temperature dependencies, it is also possible to apply switching means using an electromagnet, which is driven upon receipt of a signal of a temperature sensor, as the connection means of the present invention, for example. Any means is applicable as long as such means can connect part of the heatsink to the housing at a designated temperature and thereby form the heat conduction path. The fan may be also disposed in a single continuous housing. No matter which one of the configurations is applied, the present invention can exert the cooling effect when cooling the heat-generating electronic component inside the housing by utilizing both of the air flow and the heat transfer to the housing. It is obvious to those skilled in the art that various modifications are possible without departing from the scope of the present invention.

An electronic equipment according to the present invention includes connection means for connecting a heatsink to a housing depending on a temperature in the housing and for forming a heat conduction path from electronic components to the housing. Accordingly, the present invention promotes heat conduction from the heatsink to the housing having a large area for heat radiation depending on the temperature in addition to the cooling operation with a fan, thereby lowering a temperature of the electronic component in the housing during operation. In particular, the present invention is configured to maintain the performance of a CPU. By this cooling effect, the present invention improves reliability and safety of the electronic equipment against heat generation.

What is claimed is:

1. An electronic equipment comprising:
   a housing;
   a substrate;
   electronic components mounted on the substrate;
   a heatsink which is connected to the electronic component;
   connection means for connecting the heatsink to the housing depending on a temperature in the housing, and for forming a heat conduction path from the electronic component to the housing, wherein the connection means is configured to connect or disconnect at least part of the heatsink to or from the housing depending on whether the temperature in the housing is higher or lower than a predetermined temperature, and wherein the connection means comprises a member connected to the substrate and an end region of the heatsink and configured to change a shape depending on the temperature, and the connection means at the end region of the heatsink is configured to connect or disconnect a surface of the heatsink, which is located opposite to a surface where the connection means is connected, to the housing by using a force of change of the member; and
   a fan,
   wherein the substrate, the electronic component, the heatsink, the connection means, and the fan are ranged in the housing.

2. The electronic equipment according to claim 1, wherein the member comprises a coil spring made of a shape-memory alloy.

3. The electronic equipment according to claim 1, wherein the shape-memory alloy is an Ni—Ti system shape-memory alloy.

4. An electronic equipment comprising:
   a housing, wherein the housing comprises:
      a core housing for incorporating the substrate, the electronic component, the
      heatsink, and the connection means; and
      a cradle housing for incorporating the fan, and
      the first aperture is provided on the cradle housing and the second aperture is
      provided on the core housing;
   a substrate;
   electronic components mounted on the substrate;
   a heatsink which is connected to the electronic component;
   connection means for connecting the heatsink to the housing depending on a temperature in the housing, and for forming a heat conduction path from the electronic component to the housing; and
   a fan,
   wherein the substrate, the electronic component, the heatsink, the connection means, and the fan are arranged in the housing.

5. The electronic equipment according to claim 4, wherein the electronic component comprises a central processing unit, and the electronic equipment is a personal computer.

* * * * *